US005191516A

United States Patent [19]

Reichl

[11] Patent Number: 5,191,516

[45] Date of Patent: Mar. 2, 1993

[54] SWITCH SUPPORT

[75] Inventor: Erwin Reichl, Tergernheim, Fed. Rep. of Germany

[73] Assignee: Sachsenwerk Aktiengesellschaft, Regensburg, Fed. Rep. of Germany

[21] Appl. No.: 673,480

[22] Filed: Mar. 22, 1991

[30] Foreign Application Priority Data

Apr. 4, 1990 [DE] Fed. Rep. of Germany ....... 4010843

[51] Int. Cl.[5] .............................................. H05K 7/02

[52] U.S. Cl. .................................................... 361/417

[58] Field of Search ............... 361/417, 419, 420, 357; 200/51 R, 296

[56] References Cited

U.S. PATENT DOCUMENTS 4,536,822 8/1985 Osborne ........................ 200/51 R X

FOREIGN PATENT DOCUMENTS 346603 12/1989 European Pat. Off. .

2322372 11/1974 Fed. Rep. of Germany .

8028797 2/1981 Fed. Rep. of Germany .

OTHER PUBLICATIONS

Schalten im Vakuum, fortschrittliche Technik moderne Fertigung, *Calor EMAG Mitteilungen Heft I/II 1986,* von Horst Beck et al., pp. 9 and 21.

*Mittelspannungsleistungsschalter: Stand der Technik und Einsatzkriterien,* D. Braun et al., pp. 1183–1189.

*Primary Examiner*—Leo P. Picard

*Assistant Examiner*—D. Sparks

*Attorney, Agent, or Firm*—Spencer, Frank & Schneider

[57] ABSTRACT

An arrangement is provided for supporting a power switch on a wall of a switch drive housing. A power switch having an axial direction and including connecting members for connection to external electrical conductors is disposed in a switch chamber formed in a one-piece profiled strand of insulating material extending in the axial direction of the power switch with a generally unchanging cross section. The strand is mounted to the wall of the switch drive housing and includes a rear wall adjacent and parallel to, and spaced from the wall of the switch drive housing when the strand is mounted on the wall of the switch drive housing, opposing side walls connected to and oriented generally perpendicular to the rear wall, a front wall remote from the wall of the switch drive housing relative to the rear wall, parallel to the rear wall and connected to the side walls to define with the side walls and the rear wall the chamber for accommodating the power switch. The connecting members of the switch are brought out of the chamber through the front wall. Rear holding strips emanate form the side walls and include rear holders for supporting the connecting members in a rear portion of the chamber. Front holders are disposed in the region of the front wall for supporting the connecting members in a frontal portion of the chamber.

11 Claims, 3 Drawing Sheets

SWITCH SUPPORT

CROSS REFERENCE TO RELATED APPLICATIONS

The present application claims the rights of priority with respect to application Ser. No. P 40 10 843.0 filed Apr. 4th, 1990 in the Federal Republic of Germany, the subject matter of which is incorporated herein by reference.

BACKGROUND OF THE INVENTION

The present invention relates to an arrangement for supporting a power switch on a wall of a switch drive housing wherein a switch support composed of an insulating material and fixed to a vertical wall of the drive housing includes a chamber for accommodating the power switch, for example a vacuum power switch chamber, by way of a holding mechanism. In such an arrangement, the connecting members of the power switch to which external conductors are connected are brought out through the front wall of the housing, with a frontal, rigid, insulated support disposed between the connecting members. The rear wall of the chamber extends parallel to and is spaced from the adjacent side wall of the drive housing.

It is thus known, in connection with such switch supports, to provide a chamber composed of insulating material mounted at a vertical side wall of a drive housing, with the chamber accommodating a power switch. In one known arrangement, the chamber further includes a holding wall spaced from its rear wall, the latter being fixed to the drive housing. Between the holding wall and the rear wall of the chamber there is a drive rod assembly for the transmission of a switching movement from a drive within the switch housing to a switching lever provided at the power switch. At its top and bottom, the power switch is provided with connecting members which are fastened on supports that are connected with the rear wall. At the front, the connecting members are additionally supported against one another by a rigid insulating rod. Electrical connecting arms pass from the connecting members through a cover of insulating material placed onto the frontal face of the chamber. The chamber additionally has upper and lower terminating walls which are connected in one piece with the remaining side walls and which are provided with openings so as to ensure a convective flow of cooling air for the power switch. The bowl-shaped configuration with the special rear area for the passage of a switching rod makes it necessary to manufacture the chambers individually with tools equipped with mold cores that must be drawn perpendicular to one another, with a separate cover having to be made available in order to produce insulation all around. The gaps existing between the remainder of the chamber do not constitute a continuous insulation. Moreover, the frontal supporting rod between the connecting members requires additional space toward the cover.

SUMMARY OF THE INVENTION

It is an object of the present invention to take measures in connection with an arrangement for supporting a power switch on a wall of a switch drive housing as described above with which manufacture of the chamber is simplified while providing a compact structure.

The above and other objects are accomplished according to the invention by the provision of an arrangement for supporting a power switch on a wall of a switch drive housing, including: a power switch having an axial direction and including connecting members for connection to external electrical conductors; and a one-piece profiled strand of insulating material extending in the axial direction of the power switch with a generally unchanging cross section and including: mounting means for mounting the strand to the wall of the switch drive housing; a rear wall adjacent and parallel to, and spaced from the wall of the switch drive housing when the strand is mounted on the wall of the switch drive housing; opposing side walls connected to and oriented generally perpendicular to the rear wall; a front wall remote from the wall of the switch drive housing relative to the rear wall, parallel to the rear wall and connected to the side walls to define with the side walls and the rear wall a chamber for accommodating the switch, with the connecting members of the switch being brought out of the chamber through the front wall; rear holding strips emanating from the side walls and including rear holding means for supporting the connecting members in a rear portion of the chamber; and front holding means disposed in the region of the front wall for supporting the connecting members in a frontal portion of the chamber.

In one embodiment of the arrangement according to the present invention, the chamber may be manufactured of a profiled, semi-finished material which is produced by the meter in an extrusion molding process, for example, from a fiber reinforced duomer. It is then merely necessary to cut a piece from this profiled, semi-finished material corresponding to the required length of the chamber. The profiled, semi-finished material thus already includes the required mounting means in the form of holding strips which extend in the longitudinal direction and are provided at least in the region of the chamber rear wall. The holding means at the front may be formed either by the chamber front wall which is connected in one piece with the remaining outer walls of the chamber or by separate holding strips which extend in the region of the chamber front wall. The connecting members may then be fixed directly to these holding means to form a compact structure. The chamber is then free of gaps in the circumferential direction and requires openings only at the front where they are needed for mounting or for bringing out the connecting members. Moreover, the thus formed chamber has high mechanical strength as well as good insulating characteristics.

In order to improve the dielectric strength toward adjacent further chambers or other grounded components, the chamber side walls may be pulled forward to beyond the plane of the chamber front wall so that a partitioning function is realized in the region of the forward projecting bare terminals presented by the switch connecting members. These protracted ribs also extend longitudinally along the drawn profile and can therefore be shaped on in one piece. Moreover, the chamber side walls may be retracted beyond the rear wall and their free ends may be provided with angularly projecting bracket strips which can be fixed to the side wall of the drive housing. The spacing of the bracket strips and of the rear holding strips from the chamber rear wall are dimensioned according to the required dielectric strength of the insulation paths. Additionally, brackets are disposed at the connecting members in the rear region of the chamber for mounting to the adjacent rear holding strips and in the frontal region of the chamber for mounting to the holding means on the front holding strips or to the holding means in the front wall of the chamber. The power switch, including its connecting members, can thus be inserted in the longitudinal direction of the chamber profile so that the rear brackets engage in the space between the holding strips disposed there and the chamber rear wall, with sufficient free space being available toward the rear wall for the brackets. A corresponding amount of space is then also available between the front bracket strips and the holding means provided there. The power switches equipped with connecting members can thus be easily inserted into the chamber cavity and then placed against the respective holding means. The connecting members are therefore unable to be jammed or twisted between the holding means.

In order to permit assembly of the connecting members from the front, openings may be provided in the chamber front wall through which tools can be brought to the holding means disposed therebehind. The front openings may simultaneously serve as holding means.

The invention will now be described in greater detail with reference to embodiments thereof that are illustrated in the accompanying drawings.

DETAILED DESCRIPTION OF PREFERRED EMBODIMENTS

Figure 1:
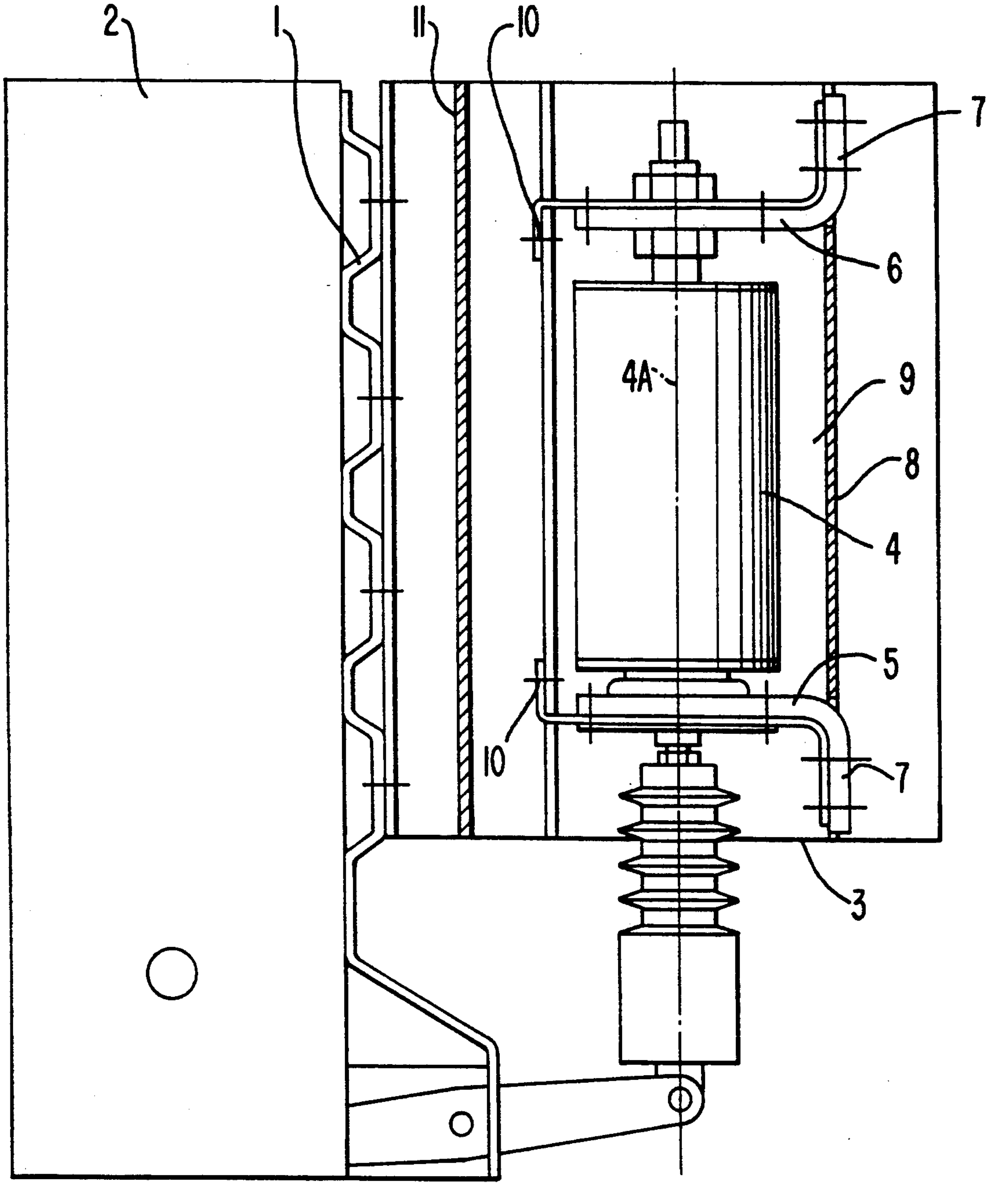
FIG. 1 is a schematic sectional side view of a switch support according to the invention.
Figure 2:
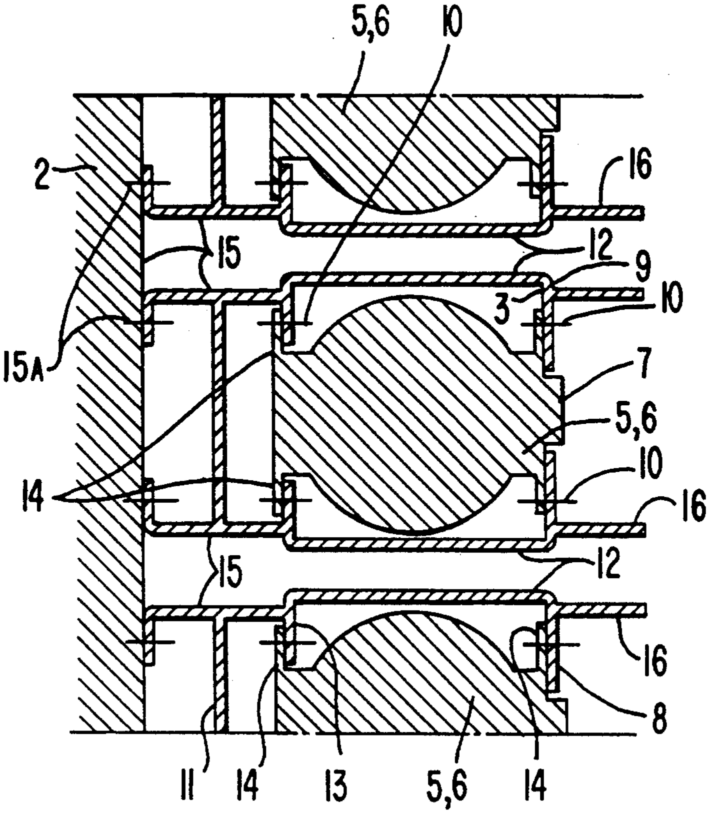
FIG. 2 is a partial top view of a plurality of switch supports according to the invention mounted adjacent to one another.

Referring to FIGS. 1 and 2, there is shown a switch support 3 formed of insulating material and fixed to a side wall 1 of a drive housing 2. Switch support 3 extends vertically and has a front wall 8, a rear wall 11, and side walls 12 which together define a switch chamber 9 for accommodating a power switch 4, particularly a vacuum switching chamber, having a vertical axis 4A. Power switch 4 has a lower connecting member 5 and an upper connecting member 6 from which connecting tabs 7 extend outwardly through chamber front wall 8 facing away from side wall 1 for connection with external current conductors (not shown). Power switch 4 is fixed in switch chamber 9, at the rear by way of holding means 10, which may be bores provided in holding strips 13 emanating from side walls 12 for accommodating screws, and at the front by similar holding means 10 disposed directly at front wall 8 or on holding strips 13 emanating from front wall 8 (see FIG. 6) or possibly from a frontal region of side walls 12.

Rear wall 11 of chamber 9 extends parallel to and is spaced from the adjacent side wall 1 of drive housing 2. Chamber front wall 8 and chamber rear wall 11 are part of a one-piece profiled member of generally unchanging cross section, with the profiled member also including chamber side walls 12 which extend generally perpendicularly to side wall 1 so that switch chamber 9 is closed when seen in the circumferential direction of the cross-sectional profile. Holding strips 13 are provided to fasten connecting members 5 and 6, these holding strips being drawn at opposite locations into switch chamber 9 from chamber side walls 12 spaced from chamber rear wall 11 and extend, as all other wall sections of the profiled strand, over its entire axial length. Holding strips 13 are provided with bores as holding means 10 in the region of connecting members 5 and 6. The connecting members are provided with brackets 14 as counter-holding means which are applied to the surface of rear holding strips 13 facing rear wall 11. Brackets 14 may then be fixed to holding strips 13, for example, by means of screw connections. Brackets 14 are also provided at the front of respective connecting member 5, 6 for fastening at the front of switch chamber 9.

According to FIGS. 2 to 5, brackets 14 are each disposed in switch chamber 9, with the front brackets lying against the interior face of chamber front wall 8 and the rear brackets lying on the surfaces of holding strips 13 facing chamber rear wall 11, so that, due to the space required for insulation purposes between holding strips 13 and chamber rear wall 11, brackets 14 can be axially inserted into switch chamber 9 at a sufficient distance from the surfaces serving for their attachment. With this arrangement, a slight sloping of the connecting member can not result in the insertion movement being blocked. Moreover, dimensional tolerances do not impede the free installability of power switch 4 and its connecting members 5, 6.

Figure 5:
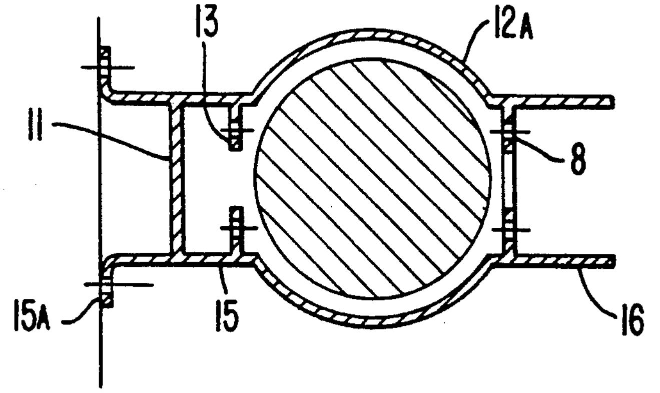
Figure 4:
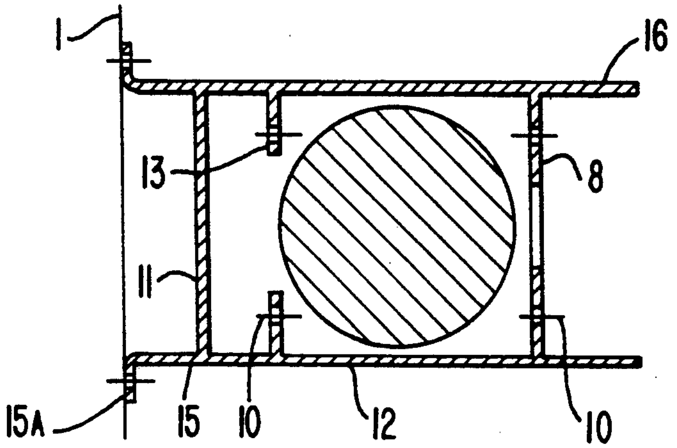

At their ends facing side wall 1, chamber side walls 12 have sections 15 that are retracted beyond rear wall 11, with their ends being configured as angled bracket strips 15A. These bracket strips 15A face one another similarly to holding strips 13 of FIG. 2. However, they may also face away from one another as shown in FIGS. 4 and 5, if sufficient space is available between adjacent switch supports 3. The bracket strips 15A may be fixed at side wall 1 by means of screws or the like.

Chamber side walls 12 may also have sections 16 which project forward beyond the plane of chamber front wall 8 to thus increase the dielectric strength of the switch support with respect to pole pieces (power switches) in adjacent switch supports 3 or other grounded components.

Figure 3:
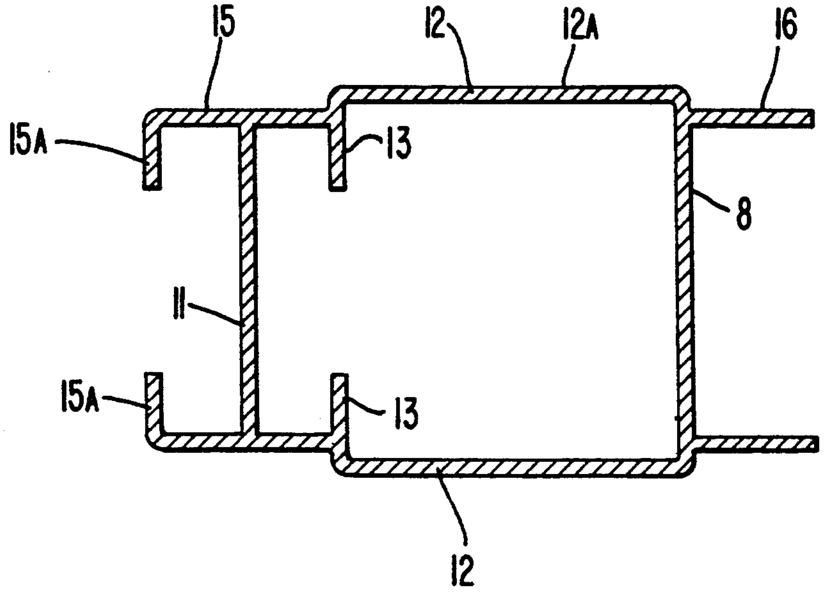
FIGS. 3 to 6 are cross-sectional views showing alternative embodiments of a switch support according to the invention.
Figure 6:
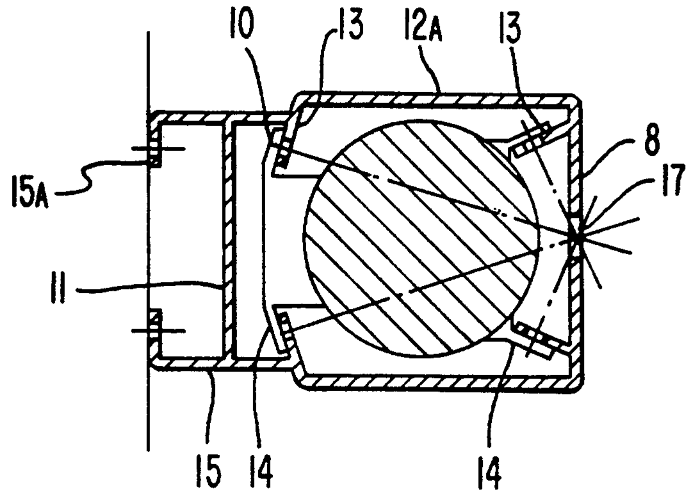

According to FIGS. 2, 3 and 6, wall sections 15 of chamber side walls 12 adjacent side wall 1 are offset inwardly beginning at rear holding strips 13 so that the profiled strand is additionally stiffened in the region of rear holding strips 13. The front wall sections 16 of chamber side walls 12 are also offset inwardly. Therefore, side walls 12 have a section 12A in the region of switch chamber 9 that is drawn outwardly. In FIG. 5, wall section 12A is shown having a convex arc, in contrast to the planar configurations of wall sections 12A shown in the other FIGURES.

According to FIG. 6, holding strips 13 are additionally integrated in the profile in the region of chamber front wall 8 as counter-supports for front brackets 14. These frontal holding strips 13 are sloped relative to chamber front wall 8, but they may also be arranged spaced from one another parallel to chamber front wall 8 similar to rear holding strips 13. The slope in the holding strips makes it possible to insert an assembly tool (not shown) through one central opening 17 provided in chamber front wall 8 as shown in FIG. 6. Preferably, holding means 10 (e.g bores) are provide in flush rows passing through chamber front wall 8. Further, in the embodiment shown in FIG. 6, holding means 10 are arranged flush with opening 17 for insertion of an assembly tool to establish screw connections at holding vantageously permits uninterrupted chamber front wall sections to the side of opening 17, thereby increasing the insulation path to adjacent components. The projecting sections 16 may then possibly be omitted, as shown, for example, in FIG. 6. Advisably, in this case, the rear holding strips 13 are also arranged at a slope toward chamber rear wall 11 so that the axes of the bores provided as holding means 10 are oriented toward opening 17.

A switch support for accommodating a power switch made of an appropriately shaped profiled strand can be easily produced as goods sold by the meter and can therefore be adapted to different length dimensions of the power switch. It is closed and made of one piece in the circumferential direction, with the chamber rear wall 11 ensuring the necessary insulation between the active components of the switch pole and the ground potential of drive housing 2. However, it is also easily possible for conductive components at different potentials to face one another so that, alternatingly, an air path of at least 10 mm, insulating chamber rear wall 11 and a further air path of at least 10 mm are connected in series. The air paths are here determined by the spacing of the angled ends 15A, and by the distance between the rear holding strips 13 and chamber rear wall 11. On the opposite side, projecting sections 16 produce partition functions. From a mechanical point of view, the fastening of switch support 3 at drive housing 2 can be easily realized, while fastening of the active components of the pole, that is power switch 4, is realized within the extruded profile. With the provision of the holding strips 13, it is possible to provide clamps or form-locking connections instead of screw connections. Neither the integration of holding strips 13 in the profile of the switch support, or chamber front wall 8 employed in the same sense to provide holding means, has any adverse influence on the good electrical characteristics of the overall structure.

Obviously, numerous and additional modifications and variations of the present invention are possible in light of the above teachings. It is therefore to be understood that within the scope of the appended claims, the invention may be practiced otherwise than as specifically claimed.

What is claimed is:

1. An arrangement for supporting a power switch on a wall of a switch drive housing, comprising:

a power switch having an axial direction and including connecting members for connection to external electrical conductors; and a one-piece profiled strand of insulating material extending in the axial direction of said power switch with a generally unchanging cross section and including:

mounting means for mounting said strand to the wall of the switch drive housing;

a rear wall adjacent and parallel to, and spaced from the wall of the switch drive housing with the strand mounted on the wall of the switch drive housing;

opposing side walls connected to and oriented generally perpendicular to said rear wall;

a front wall parallel to said rear wall and connected to said side walls to define with said side walls and said rear wall a chamber for accommodating said switch, with the connecting members of said switch being brought out of said chamber through said front wall;

rear holding strips emanating from said side walls and including rear holding means for supporting said connecting members in a rear portion of said chamber;

front holding strips emanating from said front wall; and front holding means disposed on said front holding strips for supporting said connecting members in a frontal portion of said chamber.

2. An arrangement as defined in claim 1, wherein said rear holding strips and said front holding strips each have surfaces oriented toward said rear wall and said connecting members have rear and front brackets which rest against respective ones of the surfaces of said rear and front holding strips oriented toward said rear wall.

3. An arrangement as defined in claim 2, wherein said rear and front holding strips are sloped toward said rear wall.

4. An arrangement as defined in claim 1, wherein said rear and front holding means associated with one side of a connecting member lie in a flush row passing through said front wall.

5. An arrangement for supporting a power switch on a wall of a switch drive housing, comprising:

a power switch having an axial direction and including connecting members for connection to external electrical conductors; and a one-piece profiled stand of insulating material extending in the axial direction of said power switch with a generally unchanging cross section and including:

mounting means for mounting said strand to the wall of the switch drive housing;

a rear wall adjacent and parallel to, and spaced from the wall of the switch drive housing with the strand mounted on the wall of the switch drive housing;

opposing side walls connected to and oriented generally perpendicular to said rear wall;

a front wall parallel to said rear wall and connected to said side walls to define with said side walls and said rear wall a chamber for accommodating said switch, with the connecting members of said switch being brought out of said chamber through said front wall;

rear holding strips emanating from said side walls and including rear holding means for supporting said connecting members in a rear portion of said chamber; and front holding means disposed in the region of said front wall for supporting said connecting members in a frontal portion of said chamber; wherein said side walls each include a section which is retracted beyond the rear wall and which presents an end adjacent the wall of the switch drive housing, and said mounting means comprise bracket strips attached at the respective ends of said retracted side wall sections and projecting at an angle to the respective retracted side wall section, said bracket strips each including means for fixing the respective bracket strip to the wall of the switch drive housing.

6. An arrangement as defined in claim 5, wherein said front holding means are contained within said front wall.

7. An arrangement for supporting a power switch on a wall of a switch drive housing, comprising:

a power switch having an axial direction and including connecting members for connection to external electrical conductors; and a one-piece profiled strand of insulating material extending in the axial direction of said power switch with a generally unchanging cross section and including:

mounting means for mounting said strand to the wall of the switch drive housing;

a rear wall adjacent and parallel to, and spaced from the wall of the switch drive housing with the strand mounted on the wall of the switch drive housing;

opposing side walls connected to and oriented generally perpendicular to said rear wall;

a front wall parallel to said rear wall and connected to said side walls to define with said side walls and said rear wall a chamber for accommodating said switch, with the connecting members of said switch being brought out of said chamber through said front wall, wherein each said side wall includes a section extending away from said rear wall beyond a plane defined by said front wall;

rear holding strips emanating from said side walls and including rear holding means for supporting said connecting members in a rear portion of said chamber; and front holding means disposed in the region of said front wall for supporting said connecting members in a frontal portion of said chamber.

8. An arrangement for supporting a power switch on a wall of a switch drive housing, comprising:

a power switch having an axial direction and including connecting members for connection to external electrical conductors; and a one-piece profiled strand of insulating material extending in the axial direction of said power switch with a generally unchanging cross section and including:

mounting means for mounting said strand to the wall of the switch drive housing; p2 a rear wall adjacent and parallel to, and spaced from the wall of the switch drive housing with the strand mounted on the wall of the switch drive housing;

opposing side walls connected to and oriented generally perpendicular to said rear wall;

a front wall parallel to said rear wall and connected to said side walls to define with said side walls and said rear wall a chamber for accommodating said switch, with the connecting members of said switch being brought out of said chamber through said front wall;

rear holding strips emanating from said side walls and including rear holding means for supporting said connecting members in a rear portion of said chamber; and front holding means disposed in the region of said front wall for supporting said connecting members in a frontal portion of said chamber; wherein said rear holding strips each have a rear surface facing the rear wall of said chamber, said front wall has an interior surface, said connecting members each have rear brackets which are placed against respective ones of the rear surfaces of said rear holding strips, and said connecting members each have front brackets placed against the interior surface of said front wall.

9. An arrangement for supporting a power switch on a wall of a switch drive housing, comprising:

a power switch having an axial direction and including connecting members for connection to external electrical conductors; and a one-piece profiled strand of insulating material extending in the axial direction of said power switch with a generally unchanging cross section and including:

mounting means for mounting said strand to the wall of the switch drive housing;

a rear wall adjacent and parallel to, and spaced from the wall of the switch drive housing with the strand mounted on the wall of the switch drive housing;

opposing side walls connected to and oriented generally perpendicular to said rear wall;

a front wall parallel to said rear wall and connected to said side walls to define with said side walls and said rear wall a chamber for accommodating said switch, with the connecting members of said switch being brought out of said chamber through said front wall;

rear holding strips emanating from said side walls and including rear holding means for supporting said connecting members in a rear portion of said chamber; and front holding means disposed in the region of said front wall for supporting said connecting members in a frontal portion of said chamber; wherein said front wall has a central opening and said rear and front holding means are arranged flush with said central opening.

10. An arrangement for supporting a power switch on a wall of a switch drive housing, comprising:

a power switch having an axial direction and including connecting members for connection to external electrical conductors; and a one-piece profiled strand of insulating material extending in the axial direction of said power switch with a generally unchanging cross section and including:

mounting means for mounting said strand to the wall of the switch drive housing;

a rear wall adjacent and parallel to, and spaced from the wall of the switch drive housing with the strand mounted on the wall of the switch drive housing;

opposing side walls connected to and oriented generally perpendicular to said rear wall;

a front wall parallel to said rear wall and connected to said side walls to define with said side walls nd said rear wall a chamber for accommodating said switch, with the connecting members of said switch being brought out of said chamber through said front wall;

rear holding strips emanating from said side walls and including rear holding means for supporting said connecting members in a rear portion of said chamber; and front holding means disposed in the region of said front wall for supporting said connecting members in a frontal portion of said chamber; wherein said side walls each have a rear section which begins where said rear holding strips emanate and which is retracted beyond said rear wall, said rear sections being offset inwardly toward one another.

11. An arrangement for supporting a power switch on a wall of a switch drive housing, comprising:

a power switch having an axial direction and including connecting members for connection to external electrical conductors; and a one-piece profiled strand of insulating material extending in the axial direction of said power switch with a generally unchanging cross section and including:

mounting means for mounting said strand to the wall of the switch drive housing;

a rear wall adjacent and parallel to, and spaced from the wall of the switch drive housing with the strand mounted on the wall of the switch drive housing;

opposing side walls connected to and oriented generally perpendicular to said rear wall;

a front wall parallel to said rear wall and connected to said side walls to define with said side walls and said rear wall a chamber for accommodating said switch, with the connecting members of said switch being brought out of said chamber through said front wall;

rear holding strips emanating from said side walls and including rear holding means for supporting said connecting members in a rear portion of said chamber; and front holding means disposed in the region of said front wall for supporting said connecting members in a frontal portion of said chamber; wherein said side walls bulge outwardly in the region of said power switch.

* * * * *